United States Patent [19]
Dai

[11] Patent Number: 5,877,076
[45] Date of Patent: Mar. 2, 1999

[54] OPPOSED TWO-LAYERED PHOTORESIST PROCESS FOR DUAL DAMASCENE PATTERNING

[75] Inventor: Chang-Ming Dai, Hsinchu, Taiwan

[73] Assignee: Industrial Technology Research Institute, Hsin-Chu, Taiwan

[21] Appl. No.: 949,352

[22] Filed: Oct. 14, 1997

[51] Int. Cl.$^6$ .................................................. H01L 21/44
[52] U.S. Cl. .................... 438/597; 438/624; 438/638; 438/700
[58] Field of Search ..................... 438/597, 622, 438/624, 636, 637, 638, 675, 700, 738, 740

[56] References Cited

U.S. PATENT DOCUMENTS

| | | | |
|---|---|---|---|
| 5,378,649 | 1/1995 | Huang | 437/52 |
| 5,427,649 | 6/1995 | Kim et al. | 156/661.11 |
| 5,529,953 | 6/1996 | Shoda | 437/189 |
| 5,602,053 | 2/1997 | Zheng et al. | 437/60 |
| 5,602,423 | 2/1997 | Jain | 257/52 |
| 5,614,765 | 3/1997 | Avanzino et al. | 257/774 |
| 5,635,423 | 6/1997 | Huang et al. | 438/624 |
| 5,686,354 | 11/1997 | Avanzino et al. | 438/625 |
| 5,691,238 | 11/1997 | Avanzino et al. | 438/622 |

OTHER PUBLICATIONS

S. Wolf et al. "Silicon Processing for the VLSI Era" vol. 1, Lattice Press, Sunset Beach, CA, 1986, p. 443 (No Month).

*Primary Examiner*—Tuan H. Nguyen
*Attorney, Agent, or Firm*—George O. Saile; Stephen B. Ackerman

[57] ABSTRACT

A method is disclosed for forming dual damascene interconnections in semiconductor chips through the use of opposite type two-layered photoresist process. A silicon substrate is provided having a composite layer comprising a first layer of dielectric separated from a second layer of dielectric by an intervening intermediate layer of silicon nitride. Then, a layer of positive (P-type) chemical amplification resist (CAR) is deposited over the composite dielectric layer. The P-type resist is next line patterned by exposing and developing it through a dark field mask. This is followed by cross-linking the remaining P-type resist by performing a hard-bake. An opposite polarity, namely, a negative (N-type) CAR is next formed over the opposite P-type resist, and hole patterned through a clear field mask. Because of cross-linking, the P-type resist is not affected during hole patterning of the opposite N-type resist. The hole pattern is next transferred by dry etching into the top dielectric layer and then into the intervening silicon nitride layer in the composite layer. The line pattern in the P-type CAR layer is etched into the top dielectric layer at the same time the hole pattern is transferred from the top dielectric layer into the bottom dielectric layer by the same etching process. The photoresist layers are then removed and the dual damascene structure thusly formed is filled with metal forming the line trench and hole interconnection on the semiconductor substrate.

28 Claims, 6 Drawing Sheets

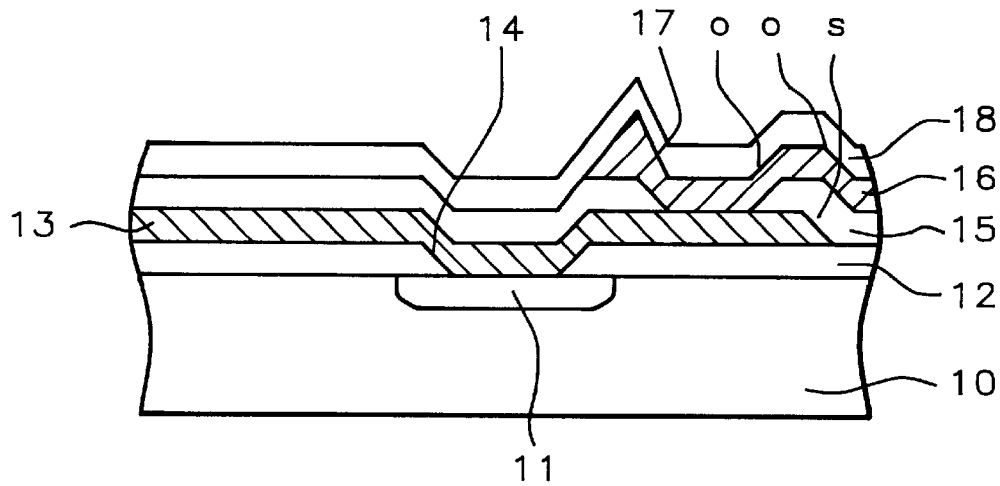
FIG. 1 – Prior Art
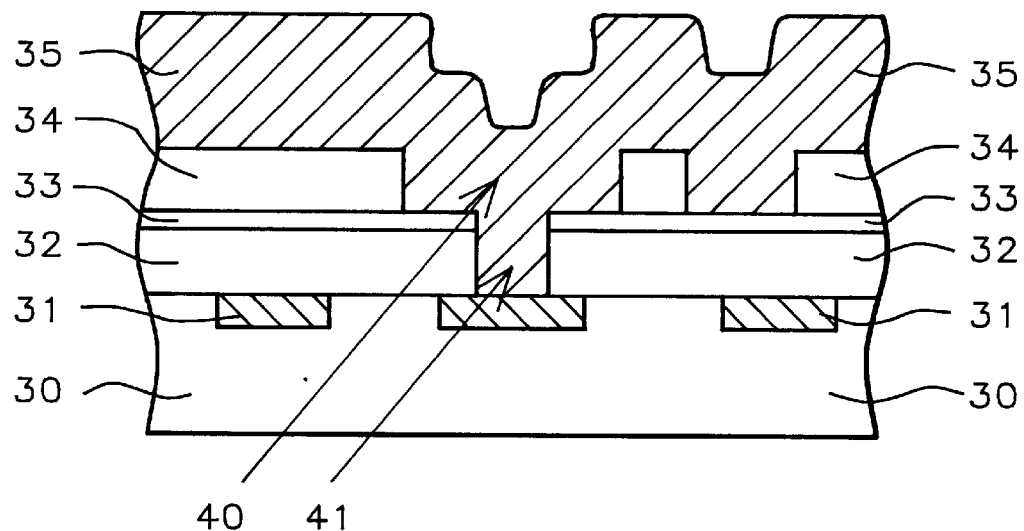
FIG. 2a – Prior Art
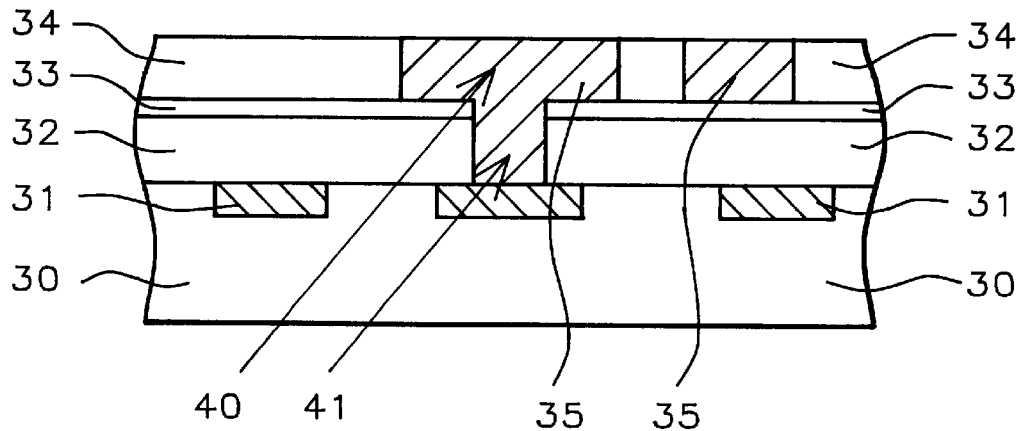
FIG. 2b – Prior Art

OPPOSED TWO-LAYERED PHOTORESIST PROCESS FOR DUAL DAMASCENE PATTERNING

RELATED PATENT

U.S. patent application by the same inventor C. M. Dai filed Oct. 14, 1997, Ser. No. 08/949,358 entitled "Two-layered TSI Processes for Dual Damascene Patterning"; filed Oct. 14, 1997, Ser. No. 08/949,350 entitled "Dual Damascene Process Using Single Photoresist Process"; filed Oct. 14, 1997, Ser. No. 08/949,353 entitled "Single-mask Dual Damascene Processes by Using Phase-shifting Mask"; and filed Oct. 14, 1997, Ser. No. 08/949,354 entitled "Self-Aligned Dual Damascene Patterning Using Developer Soluble ARC Interstitial Layer", assigned to common assignee.

BACKGROUND OF THE INVENTION

(1) Field of the Invention

The present invention relates to the manufacture of ultra large scale integrated (ULSI) circuit chips in general, and in particular, to the patterning of dual damascene interconnections in semiconductor chips through the use of opposite type two-layered photoresist process.

(2) Description of the Related Art

Different techniques of forming dual damascene structures in semiconductor substrates are well known in the art. The proposed method of using opposite type two-layered photoresist process simplifies to great extent the state of the known art of forming dual damascene structures as described later in the embodiments of this invention.

The damascene process itself is a technique where metal interconnections are inlaid in performed grooves in a substrate, and is usually a preferred method of fabricating interconnections for integrated circuits. In contrast, the more conventional interconnections are formed by blanket depositing a conductive material on an insulation layer such as silicon oxide, and then etching the desired wiring pattern on the layer. The vertical connections between the wiring layers are made separately by forming holes in the insulation layers separating the metallized layers and then filling them with the same or a different conductive material. It will be appreciated that as the number of wiring layers increase, the number of photolithographic processes required to form the interconnection and hole patterns will also increase proportionately. It is disclosed in this invention a method for reducing the number of photolithographic steps in especially the more recent dual damascene structures. This is accomplished through a novel use of an opposite type two-layered photoresist process as disclosed later in the embodiments of this invention.

Normally, a semiconductor chip contains one or more metal wiring layers that are separated from each other by an insulating layer and are further separated by still another insulating layer from the devices that are formed near the surface of the semiconductor that forms the base of the chip. The wiring stripes are connected to each other and to the devices at the appropriate places by means of holes that are filled with metal through the insulating layers. The holes that connect the metal lines to each other through the insulating layer are called via holes, while the holes that reach the underlying devices through its insulating layer are called contact holes. Typically, the holes are etched into an insulating layer after the latter has been deposited on the semiconductor substrate on which the chips are fabricated. It is common practice to next blanket deposit metal on the insulating layer thereby filling the holes and then forming the metal lines by etching through a patterned photo resist formed on the metal layer. For the first metal layer, electrical contact is made with the underlying devices through contact holes, or windows, that allow the metal to descend through the dielectric insulator to the devices. For the second and subsequent wiring layers, the process is repeated and the contact between the metal layers is made through via holes that allow the metal to descend to the lower metal layer(s). It is also common practice to fill the holes separately with metal to form metal plugs first, planarize or smoothen them next with respect to the surface of the insulating layer and then deposit metal layer to make contact with the via plugs and then subtractively etch as before to form the required "personalized" wiring layer.

To provide robust contact area at the junction where the metal lines contact the devices or the via plugs in the case of multilayer wiring, it is usually necessary to increase the dimensions of the various features in the metal line and the holes to compensate for overlay errors and process bias inherent in lithographic process. This increase in the size of the design ground rules results in a significant loss in circuit layout density. Furthermore, there is considerable development effort expended on photolithographic equipment and processes to make improvement in overlay error and process tolerances. To minimize the chip area devoted to overlay tolerance and lithography costs, several "self-aligned" processes have been developed by workers in the field.

There are also other problems associated with forming contacts between metal layers in a substrate. Where contact windows are etched into a dielectric layer, the sides of the contact windows must be sloped to guarantee good continuity of the metal layer as it descends into the contact window. The steeper the slope, the more likely it is the metallurgy will have breaks at the edges of the contact windows. However, the use of a gradually sloped sidewall to guarantee metal line continuity takes up valuable chip area and prevents contact windows from being packed as closely as desired. In addition, the use of contact windows creates an irregular and nonplanar surface which makes it difficult to fabricate the subsequent interconnecting layers as shown in FIG. 1.

The structure shown in FIG. 1 is a typical example of a semiconductor substrate fabricated using prior art techniques. After having defined device regions represented by reference (11) on substrate (10), a first insulating layer (12) is formed and patterned thereon. First level metal layer (13) is next deposited to make contact with region (11) through contact window (14). Similarly, the second level metal layer (16) makes contact with metal layer (13) through via hole (17) patterned in second insulating layer (15). The structure is passivated with a third insulating layer (18). Although the structure depicted in FIG. 1 is not to scale, it exemplifies a very irregular surface which creates reliability problems. One such problem is the potential short at location (S) between the first and second levels of metal layers, due to the thinning of the insulating layer therebetween, and still another one is the risk of a potential open circuit at locations (O), due to the thinning of the metal layer at that location.

One solution that is found in prior art in addressing the problems cited above is the dual damascene process. In its simplest form, this process starts with an insulating layer which is first formed on a substrate and then planarized. Then horizontal trenches and vertical holes are etched into the insulating layer corresponding to the required metal line pattern and hole locations, respectively, that will descend down through the insulating layer to the underlying features, that is, to device regions if through the first insulating layer, or to the next metal layer down if through an upper insulating layer in the substrate structure. Metal is next deposited over the substrate thereby filling the trenches and the holes, and hence forming metal lines and the interconnect holes simultaneously. As a final step, the resulting surface is planarized using the well-known chemical-mechanical polish (CMP), and readied to accept another dual damascene structure, that is, integrally inlaid wiring both in the horizontal trenches and vertical holes, hence the duality of the process.

A dual damascene structure before and after CMP is shown in FIGS. 2a and FIG. 2b. Two photolithographic processes and two insulator layers separated by an etch stop layer are employed to achieve the shown structure as follows: a starting planarized surface (30) is provided with patterned first level metal (31). A first layer of insulator (32) is deposited over a fist level of patterned metal to which contacts are to be selectively established. The first layer is planarized and then covered by an etch stop material (33). Contact holes are defined in the etch stop material by a first photolithography at locations where vertical plug interconnects are required. The thickness of the first insulator layer (32) is made equal to the desired plug height. The first insulator layer is not etched at this time. Next, a second insulator layer (34), having a thickness equal to the thickness of the second level of patterned metal of the mullet-level structure, is deposited over the etch stop material (33). The second insulator layer (34), in turn, is etched by second photolithography down to the etch stop material (33) to define desired wiring channels (40), some of which will be in alignment with the previously formed contact hole (41) in the etch stop material. In those locations where the contact holes are exposed, the etching is continued into the first insulator layer to uncover the underlying first level of patterned metal. The horizontal channels and vertical holes etched into the second and first insulator layers are next overfilled with metal (35). As a final step, excess metal (35) on top of the second insulator layer (34) but not in the channels (40) or holes (41) is removed by etching or chemical-mechanical polishing, as shown in FIG. 2b.

It will be appreciated by those skilled in the art that the dual damascene process alleviates the problem of registration of holes with metal lines, and the concomitant contact problems along with the issue of excessive overlay tolerances. At the same time, wiring can be kept to the minimum ground rules tolerances and also problems associated with the thinning of insulator and/or metal around sloped holes can be circumvented. However, it is also evident that the process is complicated, especially in the area where two photolithographic steps must be performed to form the vertical holes. Here, the hole pattern must first be defined lithographically after the etch stop has been formed, and also later when the hole is etched lithographically. Furthermore, two photoresist processes must be used to form the hole and line patterns. The multiplicity of the processes results in lower productivity, and increased cost.

Nevertheless, in prior art, some of the dual damascene steps have been used to advantage. For example, Huang in U.S. Pat. No. 5,378,649 teaches to form two sets of resist patterns through a double photoloithograhpic process in order to form metal lines over buried bit lines so as to better protect the bit lines from code implants. An improved dual damascene structure is also provided by Jain in U.S. Pat. No. 5,602,423 where through lithographic means he introduces support columns or pillars embedded in the damascene conductors inlaid in the trenches so that during the abrasive chemical-mechanical polishing, the pillars prevent the excessive removal or dishing of the conductors in areas where the conductors may span relatively long distances. Shoda, on the other hand, discloses in U.S. Pat. No. 5,529,953 a method of manufacturing a stud (vertical metal plug) and (horizontal) interconnect in a dual damascene structure using selective deposition where the selective deposition is accomplished through repeated application of masks and photolithographic processes. Similarly, Zheng in U.S. Pat. No. 5,602,053 discloses still another dual damascene antifuse structure where sandwiched layers are formed.

In still another approach, recognizing the multiplicity of mask patterning steps in dual damascene process, Avanzino in U.S. Pat. No. 5,614,765 teaches the use of one mask pattern for the formation of both the conductive lines and the vias simultaneously. In U.S. Pat. No. 5,427,649, Kim uses a silylation process to avoid the forming of an etch stop in a multi-layer photo resist process. What is needed is a simplified two-layered photo resist process where neither resist is affected by the processes performed on the other.

SUMMARY OF THE INVENTION

It is therefore an object of this invention to provide a method of forming dual damascene interconnections in semiconductor chips through the use of opposite type two-layered photoresist process.

It is another object of this invention to provide a method of forming dual damascene structure free of photoresist residues.

It is yet another object of this invention to provide a method for improving the alignment of a wiring layer to underlying interconnect hole pattern.

It is still another object of this invention to provide a method for reducing overlay tolerances and process bias in order to increase the packing density of ultra large scaled integrated chips.

These objects are accomplished by providing a silicon substrate having a composite layer of insulation deposited thereon whereby said composite layer comprises a first layer of dielectric separated from a second layer of dielectric by an intervening intermediate layer of silicon nitride. Then, a layer of positive (P-type) chemical amplification resist (CAR) is deposited over the composite dielectric layer. The P-type resist is next hole patterned by exposing and developing it through a dark field mask. This is followed by cross-linking the remaining P-type resist by performing a hard-bake. An opposite polarity, namely, a negative (N-type) CAR is next formed over the opposite P-type resist, and line patterned through a clear field mask. Because of cross-linking, the P-type resist is not affected during line patterning of the opposite N-type resist. The hole pattern is next transferred by dry etching into the top dielectric layer and then into the intervening silicon nitride layer in the composite layer. Subsequently, the line pattern in the top N-type resist is transferred into the bottom P-type resist by anisotropic resist etching. The line pattern in the P-type CAR layer is etched into the top dielectric layer at the same time the hole pattern is transferred from the top dielectric layer into the bottom dielectric layer by the same etching process. The photoresist layers are then removed and the dual damascene structure thusly formed is filled with metal forming the line trench and hole interconnection on the semiconductor substrate.

BRIEF DESCRIPTION OF THE DRAWINGS

In the accompanying drawings, similar numerals refer to similar parts throughout the several views.

FIG. 1 is a partial cross-sectional view of a semiconductor substrate showing a non-planar multilayered metal structure resulting from prior art methods.

FIGS. 2a–2b are partial cross-sectional views of a semiconductor substrate showing the conventional forming of a dual damascene structure before and after planarization.

DESCRIPTION OF THE PREFERRED EMBODIMENTS

Figure 3A:
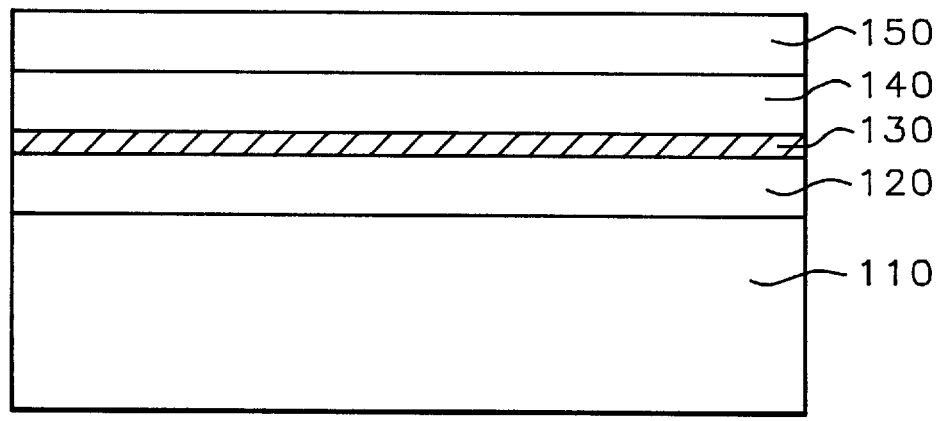
FIG. 3a is a partial cross-sectional view of a semiconductor showing the forming of a positive, P-type photoresist layer on a composite layer of insulation according to this invention.

Referring now to the drawings, in particular to FIGS. 3a–3l, there are shown schematically steps of forming dual damascene interconnections in semiconductor chips through the use of opposite type two-layered photoresist process.

In FIG. 3a, substrate (110), preferably silicon, is provided with a composite tri-layer dielectric insulation comprising bottom and top layers (120) and (140), respectively, and a middle layer (130). A layer of photoresist (150) is next formed on the composite layer.

It is preferred that top and bottom layers of insulation, that is, layers (120) and (140), are plasma enhanced chemical vapor deposited (PECVD) phosphosilicate glass (PSG) in a low pressure environment at a chamber pressure between about 0.5 to 10 torr, temperature between about 300° C. to 600° C. with reactant gas $SiH_4$ at a flow rate between about 100 to 500 standard cubic centimeters per minute (sccm) in a diluent carrier gas $PH_3$ at a flow rate between about 20 to 300 sccm. The thickness of bottom (120) and top (140) layers of dielectric are between about 0.3 to 0.7 micrometers ($\mu$m).

Middle layer (130) is an etch barrier film such as silicon nitride (SiN) to prevent the upper trench (line) patterns of dual damascene from being etched through if the layer underlying the composite insulation layer is for via plug hole or contact hole (not shown). (It will briefly be noted here that substrate (110) in FIG. 3a is provided with a substructure of devices formed in the substrate and/or metal layers thereof, and as they are not significant to the invention, they are not described in detail in order not to unnecessarily obscure the present invention.) Other barrier films may be used, however silicon nitride is preferred because it becomes part of the composite insulation layer and has different etch characteristics than oxide regions. That is, silicon nitride allows a selective etch process with respect to different underlying materials. Spin-on-glass and plasma nitride are also suitable as etch stop materials when polyimide layers are used. It is preferred that silicon nitride is deposited using plasma enhanced PECVD and that it has a thickness between about 500 to 2000 angstroms (Å).

The surface of layer (140) in FIG. 3a is planarized, preferably using chemical-mechanical polishing process. Etching back or using capping method are also suitable for planarizing the surface of layer (140). Then, a first layer of photoresist (150) is formed on PSG layer (140). It is preferred that photoresist (150) is a chemical amplification resist (CAR) and it is of positive (P)-type. The CAR is made using a photo acid generator (PAG) instead of the conventional photosensitive agent, and an example of P-type resist is K2G made by JSR in Japan. The preferred thickness of first layer of photoresist (150) shown in FIG. 3a is between about 0.4 to 0.9 $\mu$m.

Figure 3B:
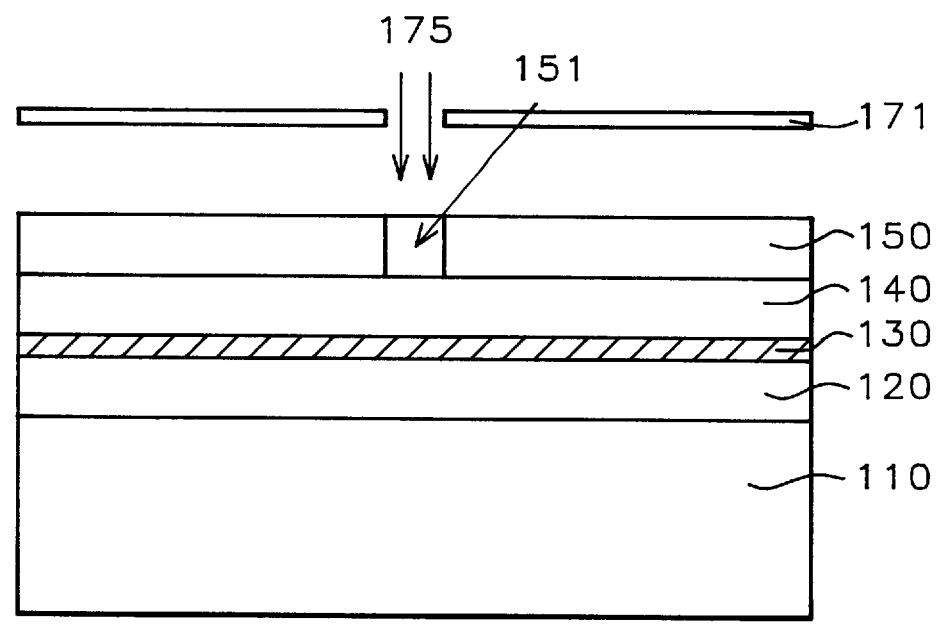
FIGS. 3b and 3c show the hole patterning of the P-type photoresist of FIG. 3a of this invention by exposure and development through a dark-field mask.
Figure 3C:
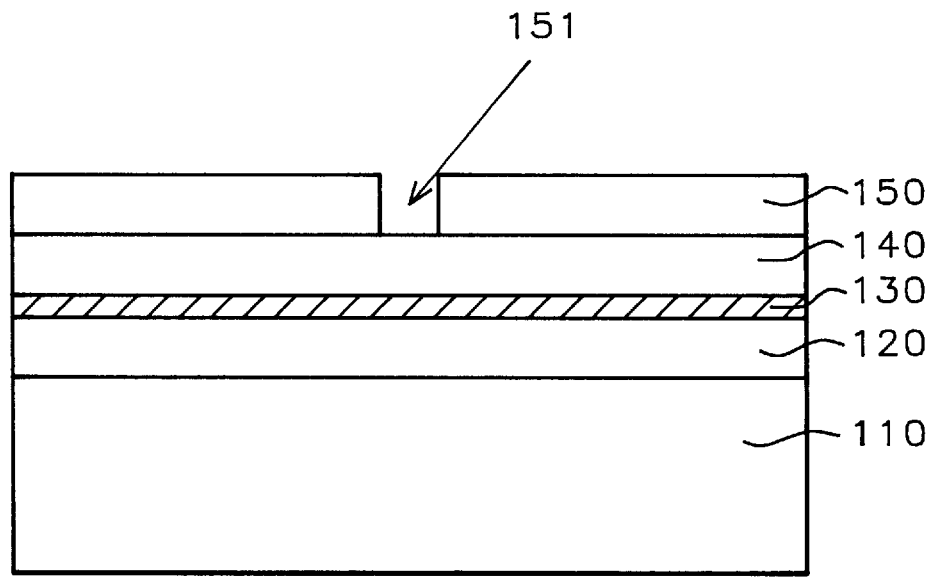

Next, the layer of P-type CAR (150) is exposed through a dark field mask (171) having a hole pattern as shown in FIG. 3b. As it will be known by those skilled in the art, in a dark-field mask, the field or background areas are opaque. Thus, light (175) exposes only those areas on the layer of P-type CAR corresponding to the hole patterns in mask (175), and reacts with the base resin in the resist to form hole regions that are soluble in a photo developing solution. The hole pattern (151) shown in FIG. 3c is then formed by developing the P-type CAR with a conventional "stream puddle" technique using a 2.38% TMAH solution for about 40 to 70 seconds. In this technique, a fixed amount of the developer solution is dispensed on the stationary wafer and after a required develop dwell time, the developing action is stopped by directing a stream of deionized water onto the developed wafer followed by a spin-dry. (For a better description, see S. Wolf and R. N. Tauber, "Silicon Processing for the VLSI Era," vol. 1, Lattice Press, Sunset Beach, Calif., 1986, p.443.)

In accordance with a key aspect of this invention, the hole patterned layer (150) is next hard baked at a temperature between about 110° to 130° C. This is performed in order to cross-link the remaining portion of the P-type CAR that was not exposed by light stopped by the dark portion of dark-field mask (171) of FIG. 3b. As will be seen shortly, this is a critical step in that the P-type CAR layer with the hole pattern is now "hardened" and therefore, will not be affected when the next layer developed.

Figure 3D:
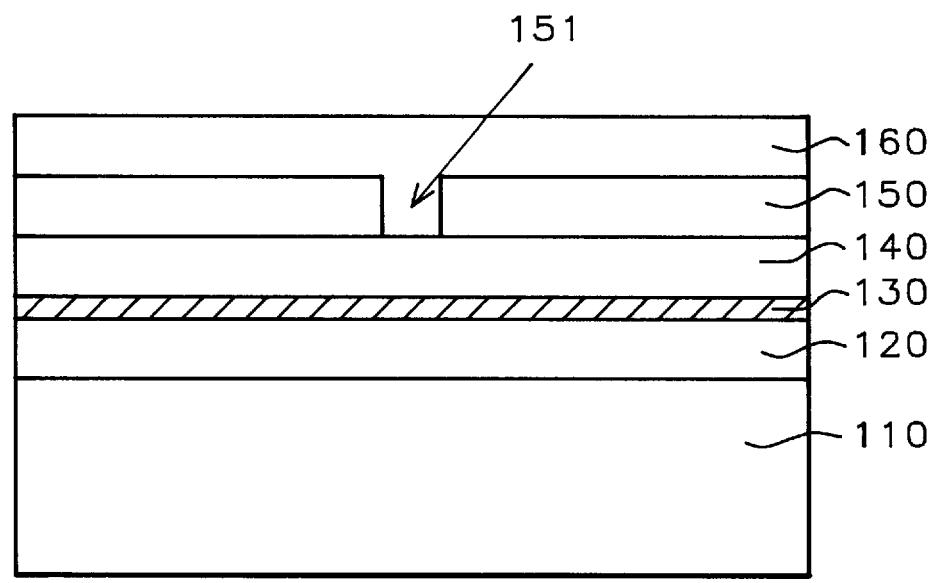
FIG. 3d shows the forming of a negative N-type photoresist over the opposite P-type photoresist FIG. 3c of this invention.

The next layer (160) is a negative N-type photoresist which is next formed over the previous, and of opposite polarity, P-type CAR (150) as shown in FIG. 3d. As is known in the art, positive and negative resists are sometimes referred to as being of opposite polarity. It is preferred that photoresist (160) is a chemical amplification resist (CAR) comprising a photo acid generator (PAG) instead of the conventional photosensitive agent, and an example of P-type resist is N908 made by TOK of Japan. The preferred thickness of the N-type Car (160) layer shown in FIG. 3d is between about 0.4 to 0.9 $\mu$m.

Figure 3E:
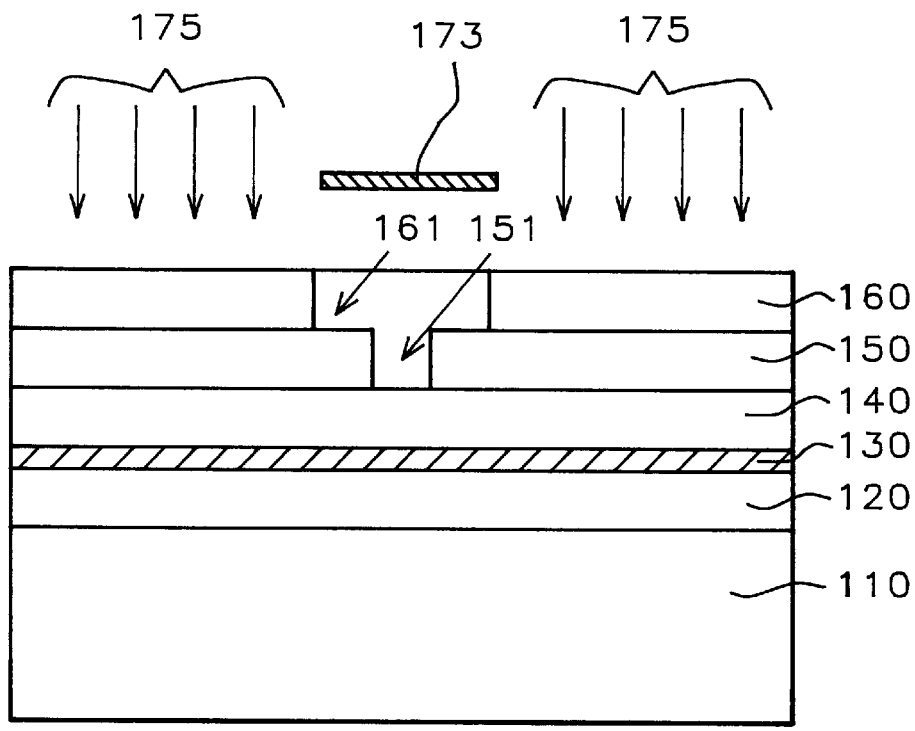
FIGS. 3e–3f show the line patterning of the N-type photoresist of FIG. 3d of this invention by exposure and development through a clear-field mask.
Figure 3F:
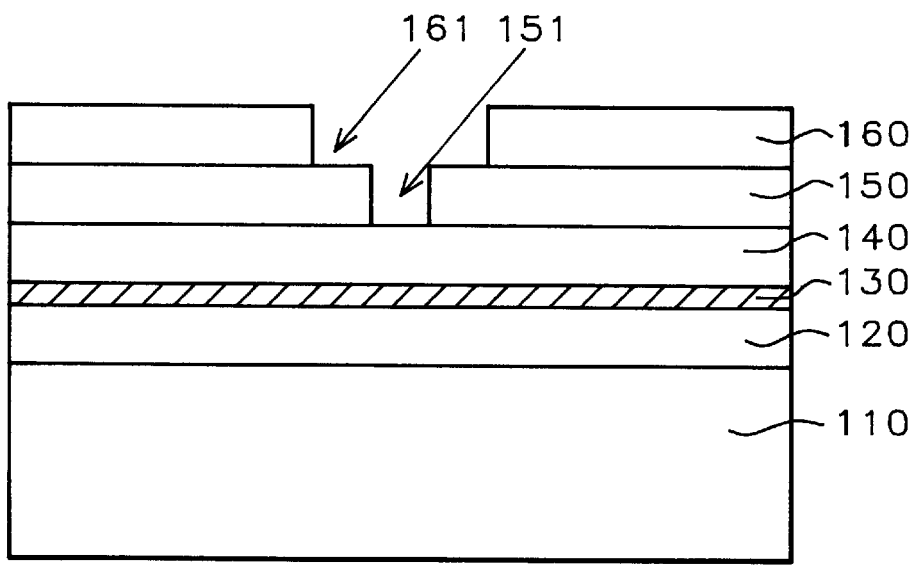

When an N-type CAR is exposed to light, the photo acid generator (PAG) component crosslinks. Thus, in FIG. 3e, a clear-field mask is used to expose N-type layer through a mask (173) having a line pattern. Only field regions are exposed to energy levels between about 10 to 80 milijoules (mj)/cm². The unexposed areas form line pattern (161) as shown in FIG. 3e. Subsequently, when layer (160) is developed with a solution comprising 2.38% TMAH in a stream puddle for about 45 to 70 seconds, only the unexposed areas of the N-type resist, namely, line pattern (161) and the underlying hole pattern (151) are removed as shown in FIG. 3f. Neither the cosslinked N-type layer (160) nor the underlying cross-linked P-type layer (150) are affected by the developing solution. Crosslinking process is aided by hardbaking the CAR between about 110° to 130° C. for about 30 to 120 seconds on a conventional proximity hot plate.

Figure 3G:
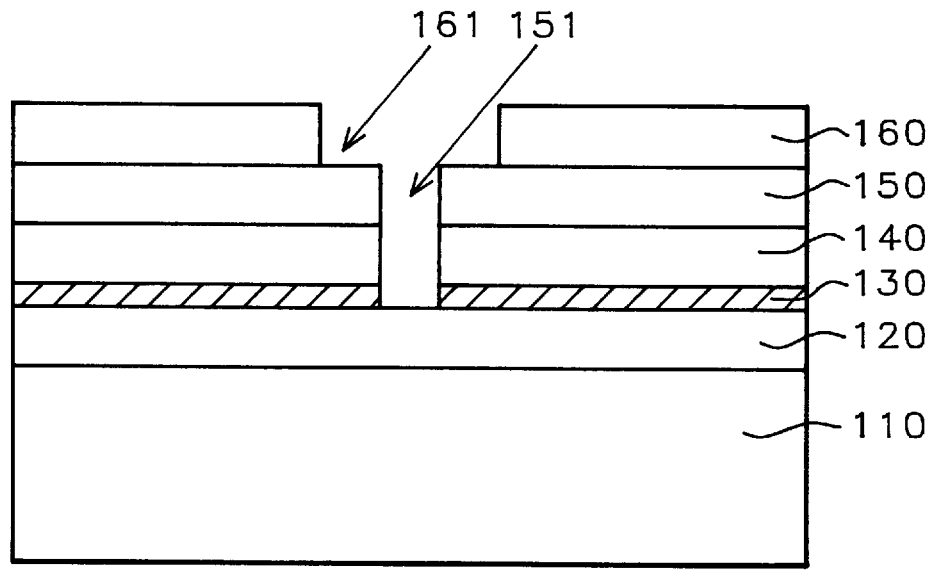
FIGS. 3g shows the transferring of the hole pattern from the lower layer of P-type photoresist into the top and intermediate layers of the composite layer of FIG. 3f of this invention.

Using the hole pattern (151) in N-type layer of photoresist (150) as a mask, top oxide layer (140) is next etched to transfer the hole pattern as shown in FIG. 3g. It is preferred that the recipe used for dry etching the oxide layer in a HDP oxide etcher comprises gases Ar, $CHF_3$ and $C_4F_8$ at a flow rate between about 50 to 150 sccm, 10 to 50 sccm, and 0 to 22 sccm, respectively. The recipe is next changed to a recipe comprising Ar, $CHF_3$ and $CF_4$ at a flow rate between about 50 to 150, 0 to 100 and 0 to 50 sccm, respectively in order to etch the SiN layer (170) shown in FIG. 3g in a nitride etcher. It is also preferred that the etching selectivity of oxide is higher than ten so that the thickness of the photoresist is maintained while etching the oxide layer.

Figure 3H:
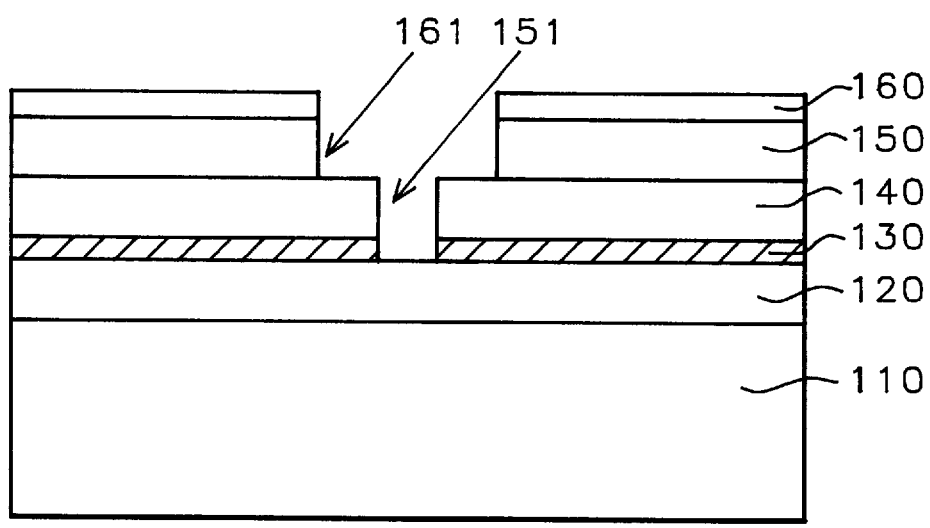
FIG. 3h shows the transferring of the line pattern from the top layer N-type photoresist into the lower layer P-type photoresist of FIG. 3g of this invention.
Figure 3I:
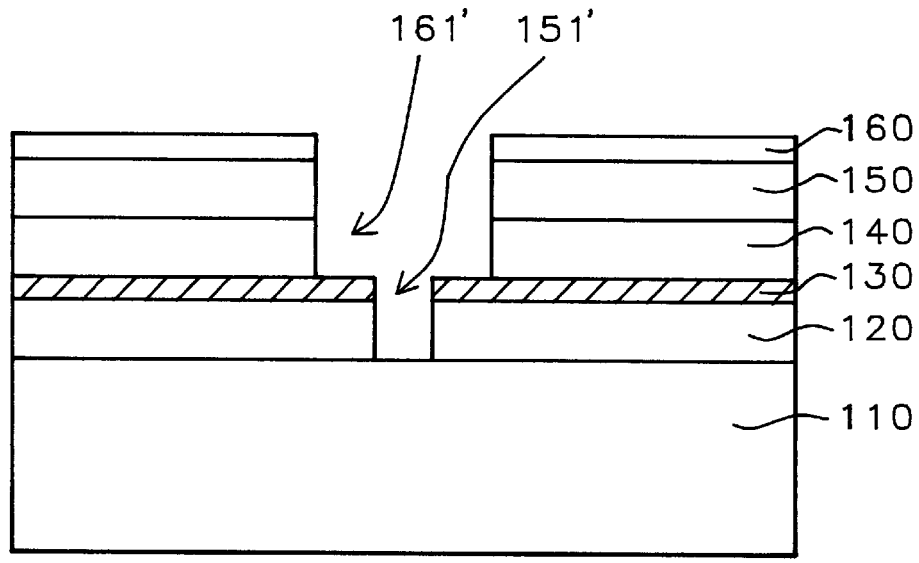
FIG. 3i shows the simultaneous transfer of line pattern into the top dielectric layer and hole pattern into the lower dielectric layer of FIG. 3h of this invention.

Line pattern (161) in photoresist layer (160) is next extended down to the top of oxide layer (140) with a blanket resist dry etch recipe comprising gases $O_2$, He and $CF_4$ at a flow rate between about 10 to 250 sccm, 40 to 80 sccm, and 0 to 50 sccm, respectively, and the etching performed in a resist etcher. It will be appreciated that in this important step, any resist residue in either the hole pattern (151) or in the line pattern (161) will be anisotropically removed as shown in FIG. 3h. Subsequently, photoresist layer (150) used to form hole pattern (151) is now used as shown in FIG. 3i to transfer line pattern (161) into the top oxide layer (140). This is accomplished while simultaneously transferring hole pattern (151) into the lower oxide layer (120) by etching in a HDP oxide etcher with a recipe comprising gases Ar, $CHF_3$ and $C_4F_8$ at a flow rate between about 50 to 150 sccm, 10 to 50 sccm, and 0 to 22 sccm, respectively.

Figure 3J:
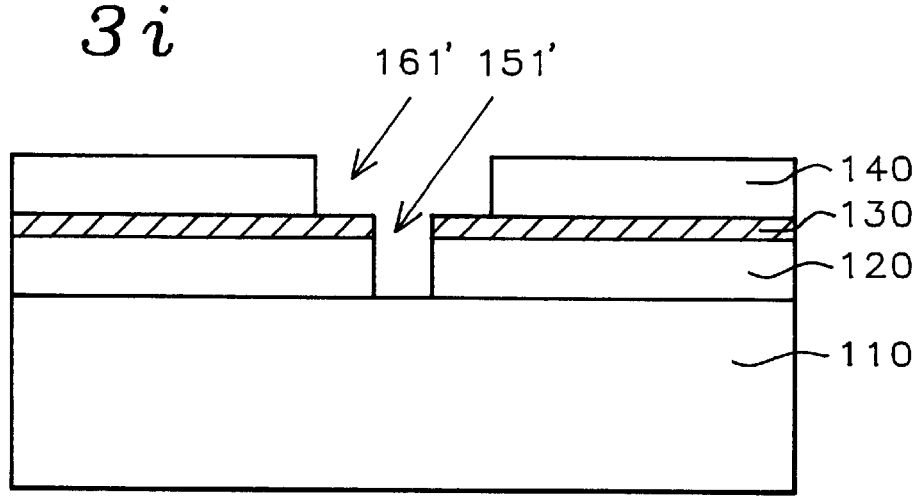
FIG. 3j shows the dual damascene structure formed according to this invention after the removal of photoresist layers in FIG. 3i.
Figure 3K:
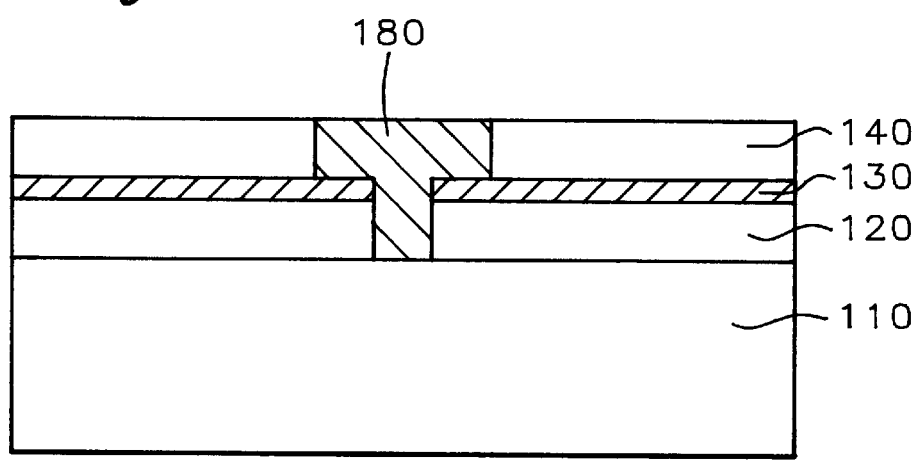
FIG. 3k is a partial cross-sectional view of a semiconductor substrate showing the depositing of metal into trench and hole of FIG. 3j to form a dual damascene interconnection according to this invention.

FIG. 3j shows the dual damascene structure comprising line trench (161') and vertical hole (151') formed using two photoresist layers of opposite polarity, but employing a single photolithographic process. The dual damascene metal interconnect 180 of FIG. 3k is finally formed by depositing metal into the horizontal line trench and vertical hole combination in the composite insulation layer and planarizing the same. It will be understood that the vertical hole may represent a contact hole or a via hole depending upon the nature of the underlying layer, that is, whether the underlying layer is the silicon substrate itself or a wiring layer. It will also be understood by those skilled in the art that various changes in form and details may be made without departing from the spirit and scope of the invention.

While the invention has been particularly shown and described with reference to the preferred embodiments thereof, it will be understood by those skilled in the art that various changes in form and details may be made without departing from the spirit and scope of the invention.

What is claimed is:

1. A method of dual damascene patterning through the use of opposed two-layered photoresist process comprising the steps of:

providing a substrate having a composite layer of insulation deposited thereon whereby said composite layer comprises a first layer of dielectric separated from a second layer of dielectric by an intervening intermediate layer of dielectric;

forming a first photoresist layer on said composite layer of dielectric insulation;

hole patterning said first photoresist layer by exposing and wet developing said first photoresist layer using a first mask;

cross-linking said first photoresist layer;

forming a second photoresist layer on said first photoresist layer;

line patterning said second photoresist layer by exposing and wet developing said second photoresist layer using a second mask;

etching said second layer of dielectric underlying said first layer of photoresist using said patterned layer of first photoresist as a mask thereby transferring said hole pattern in said layer of photoresist into said second layer of dielectric;

etching said intermediate layer of dielectric underlying said second layer of dielectric using said first layer of photoresist as a mask thereby transferring said hole pattern in said layer of photoresist into said intermediate layer of dielectric;

etching said second layer of photoresist to extend downward said line pattern until second layer of dielectric is reached;

etching said composite layer of insulation thereby transferring said line pattern in said first layer of photoresist into said second layer of dielectric to form a line trench, and simultaneously transferring said hole pattern in said intermediate layer of dielectric into said first layer of dielectric to form a hole;

removing said layers of photoresist; and depositing metal into said line trench and said hole to form a dual damascene structure.

2. The method of claim 1, wherein said composite layer of insulation is planarized by means of chemical-mechanical polishing (CMP).

3. The method of claim 1, wherein said first layer of dielectric of said composite layer is phosphosilicate glass (PSG) having a thickness between about 0.3 to 0.7 micrometers ($\mu$m).

4. The method of claim 1, wherein said intermediate layer of dielectric is silicon nitride (SiN) having a thickness between about 500 to 2000 angstroms (Å).

5. The method of claim 1, wherein said second layer of dielectric of said composite layer is phosphosilicate glass (PSG) having a thickness between about 0.3 to 0.7 micrometers ($\mu$m).

6. The method of claim 1, wherein said first layer of photoresist is a positive chemical amplification resist (CAR) with a photo acid generator (PAG) component.

7. The method of claim 1, wherein said first layer of photoresist has a thickness between about 0.40 to 0.90 $\mu$m.

8. The method of claim 1, wherein said first mask has positive resist hole patterns with dark field reticle.

9. The method of claim 1, wherein said wet developing said first photoresist layer is accomplished with a recipe comprising 2.38% TMAH developer solution stream puddled for about 45 to 70 seconds.

10. The method of claim 1, wherein said cross-linking said first photoresist layer is accomplished with a hard bake at a temperature between about 110° to 130° C. for between about 0.5 to 2 minutes.

11. The method of claim 1, wherein said second layer of photoresist is a negative type chemical amplification resist (CAR) with a photo acid generator (PAG) component.

12. The method of claim 1, wherein said second layer of photoresist has a thickness between about 0.40 to 0.90 μm.

13. The method of claim 1, wherein said second mask has negative resist line patterns with clear field reticle.

14. The method of claim 1, wherein said wet developing said second photoresist layer is accomplished with a recipe comprising 2.38% TMAH developer solution stream puddled for about 45 to 70 seconds.

15. The method of claim 1, wherein said etching said second layer of dielectric underlying said first layer of photoresist using said patterned first layer of photoresist as a mask thereby transferring said hole pattern in said first layer of photoresist into said second layer of dielectric is accomplished with etch recipe comprising gases Ar, $CHF_3$ and $C_4F_8$ at a flow rate between about 50 to 150 sccm, 10 to 50 sccm, and 0 to 22 sccm, respectively, and used in a HDP oxide etcher.

16. The method of claim 1, wherein said etching said intermediate layer of dielectric underlying said second layer of dielectric using said first layer of photoresist as a mask thereby transferring said hole pattern in said first layer of photoresist into said intermediate layer of dielectric is accomplished by using etch recipe comprising gases Ar, $CHF_3$ and $CF_4$ at a flow rate between about 50 to 150, 0 to 100 and 0 to 50 sccm, respectively, and used in a nitride etcher.

17. The method of claim 1, wherein said etching of said second layer of photoresist to extend downward said line pattern until said second layer of dielectric is reached is accomplished with recipe comprising gases $O_2$, He and $CF_4$ at a flow rate between about 10 to 250 sccm, 40 to 80 sccm, and 0 to 50 sccm, respectively, in a resist etcher.

18. The method of claim 1, wherein etching said composite layer of insulation thereby transferring said line pattern in said layer of photoresist into said second layer of dielectric to form a line trench, and simultaneously transferring said hole pattern in said intermediate layer of dielectric into said first layer of dielectric to form a contact hole is accomplished with etch recipe comprising gases Ar, $CHF_3$ and $C_4F_8$ at a flow rate between about 50 to 150 sccm, 10 to 150 sccm, and 0 to 22 sccm, respectively, in a HDP oxide etcher.

19. The method of claim 1, wherein said removing said layer of photoresist is accomplished by $O_2$ plasma ashing and then wet stripping said photoresist by using $H_2SO_4$, $H_2O_2$ and $NH_4OH$ solutions.

20. The method of claim 1, wherein said metal deposited to form a dual damascene structure is copper or aluminum-copper alloy.

21. A method of dual damascene patterning through the use of opposed two-layered photoresist process comprising the steps of:

providing a substrate having a composite layer of insulation deposited thereon whereby said composite layer comprises a top layer of dielectric separated from a bottom layer of dielectric by an intervening intermediate layer of dielectric;

forming a layer of positive (P-type) chemical amplification resist (CAR) on said composite layer;

hole patterning said layer of P-type CAR using a dark-field mask;

cross-linking said layer of P-type CAR;

forming a layer of negative (N-type) chemical amplification resist (CAR) on said layer of opposite P-type CAR;

line patterning said layer of N-type photoresist using a clear-field mask;

transferring said hole pattern in said layer of P-type CAR into said top and intermediate layers of said composite layer of insulation by etching;

transferring said line pattern in said layer of N-type CAR into said second layer of dielectric to form a line trench, and simultaneously transferring said hole pattern in said intermediate layer of dielectric into said first layer of dielectric to form an interconnect hole;

removing said layers of photoresist; and depositing metal into said trench and said hole to form a dual damascene structure and planarizing said composite layer.

22. The method of claim 21, wherein said composite layer is phosphosilicate glass (PSG).

23. The method of claim 21, wherein said intermediate layer of said composite layer of insulation is silicon nitride with a thickness between about 500 to 2000 angstroms (Å).

24. The method of claim 21, wherein said hole patterning said layer of P-type CAR is accomplished with a recipe comprising an energy exposure between about 10 to 80 millijoules (mj)/$cm^2$ and stream puddling in a 2.38% TMAH solution for about 40 to 70 seconds.

25. The method of claim 21, wherein said cross-linking is accomplished with a recipe comprising hard-baking between about 110° to 130° C. for about 30 to 120 seconds on a proximity hot-plate.

26. The method of claim 21, wherein said line patterning said layer of N-type CAR is accomplished with a recipe comprising an energy exposure between about 10 to 80 milijoules (mj)/$cm^2$ and stream puddling in a 2.38% TMAH solution for about 40 to 70 seconds.

27. The method of claim 21, wherein said transferring said line pattern in said layer of photoresist into said second layer of dielectric to form a line trench, and simultaneously transferring said hole pattern in said intermediate layer of dielectric into said first layer of dielectric to form a inter-connect hole is accomplished with an etch recipe comprising gases Ar, $CHF_3$ and $C_4F_8$ at a flow rate between about 50 to 150 sccm, 10 to 150 sccm, and 0 to 22 sccm, respectively, and used in a HDP oxide etcher.

28. The method of claim 21, wherein said metal deposited to form a dual damascene structure is copper or aluminum-copper alloy.

* * * * *